(12) United States Patent
Howell et al.

(10) Patent No.: US 7,598,724 B2
(45) Date of Patent: Oct. 6, 2009

(54) FLEXIBLE CURRENT TRANSFORMER ASSEMBLY

(75) Inventors: Donald W. Howell, Troutville, VA (US);
Samuel A. Taylor, Wirtz, VA (US);
Danny K. Dyess, Roanoke, VA (US);
Frank O. Blevins, Salem, VA (US);
Mark W. Vinson, Roanoke, VA (US)

(73) Assignee: Admmicro Properties, LLC, Roanoke, VA (US)

( * ) Notice: Subject to any disclaimer, the term of this patent is extended or adjusted under 35 U.S.C. 154(b) by 0 days.

(21) Appl. No.: 12/015,747

(22) Filed: Jan. 17, 2008

(65) Prior Publication Data

US 2008/0211484 A1    Sep. 4, 2008

Related U.S. Application Data

(60) Provisional application No. 60/885,798, filed on Jan. 19, 2007.

(51) Int. Cl.
*G01R 15/18* (2006.01)
(52) U.S. Cl. ............................................. 324/127
(58) Field of Classification Search .............. 324/158.1, 324/127, 207.2; 336/223–225; 323/257–258
See application file for complete search history.

(56) References Cited

U.S. PATENT DOCUMENTS

| | | | | |
|---|---|---|---|---|
| 3,286,178 A | * | 11/1966 | Ultcht | ............... 324/107 |
| 4,174,499 A | * | 11/1979 | Waurick | ............... 324/107 |
| 4,799,005 A | | 1/1989 | Fernandes | |
| 4,933,630 A | * | 6/1990 | Dupraz | ............... 324/107 |
| 5,852,395 A | | 12/1998 | Bosco et al. | |
| 6,034,521 A | * | 3/2000 | Eckardt | ............... 324/96 |
| 6,184,672 B1 | | 2/2001 | Berkcan | |
| 6,295,190 B1 | | 9/2001 | Rinaldi et al. | |
| 6,357,932 B1 | * | 3/2002 | Auld | ............... 385/76 |
| 6,594,771 B1 | * | 7/2003 | Koerber et al. | ............... 713/330 |
| 6,614,218 B1 | * | 9/2003 | Ray | ............... 324/117 R |
| 6,728,646 B2 | | 4/2004 | Howell et al. | |
| 6,791,341 B2 | | 9/2004 | Shenai et al. | |
| 6,810,069 B2 | | 10/2004 | Kojovic et al. | |
| 6,885,183 B2 | * | 4/2005 | Kato | ............... 324/117 R |
| 6,940,702 B2 | | 9/2005 | Kojovic et al. | |
| 6,963,195 B1 | | 11/2005 | Berkcan | |
| 7,106,162 B2 | | 9/2006 | Saito | |
| 2004/0008461 A1 | | 1/2004 | Kojovic et al. | |
| 2004/0027748 A1 | | 2/2004 | Kojovic et al. | |

(Continued)

*Primary Examiner*—Jermele M Hollington
*Assistant Examiner*—Trung Q Nguyen
(74) *Attorney, Agent, or Firm*—Novak Druce + Quigg LLP

(57) ABSTRACT

A current transformer assembly includes at least one Rogowski coil having a first closeable loop with an electrically conductive coil member and a first pair of terminals. An integrator unit has respectively a cable connected across the first pair of terminals of a respective Rogowski coil. Each respective Rogowski coil provides an output voltage received by the integrator assembly caused by when a respective electrical conductor on a phase of a multiphase circuit is arranged within an opening of the closeable first loop of the respective Rogowski coil, and provides an output signal proportional to a current in a conductor arranged in an opening of a Rogowski coil. At least one of the Rogowski coils includes an inline calibration unit for fast calibration and recalibration when retrofitting a monitor module that monitors a value of the current in one or more conductors.

24 Claims, 3 Drawing Sheets

U.S. PATENT DOCUMENTS

2005/0017751 A1 1/2005 Gunn et al.
2005/0047045 A1* 3/2005 Puskar et al. ............... 361/115
2006/0220774 A1 10/2006 Skendzic
2006/0232265 A1 10/2006 Fritsch et al.

* cited by examiner

FLEXIBLE CURRENT TRANSFORMER ASSEMBLY

CROSS-REFERENCE TO RELATED APPLICATION

This claims priority from U.S. provisional patent application No. 60/885,798, filed Jan. 19, 2007, incorporated herein by reference.

BACKGROUND OF THE INVENTION

1. Field of the Invention

The present invention relates to a system and a method to integrate Rogowski coils with integrator electronics to create an optimal current transformer (CT) sub-system for use in permanent electricity monitoring. More particularly, the present invention is related to current transformer assemblies. Typically, a current transformer assembly includes at least one Rogowski coil having a first closeable loop with an electrically conductive coil member and a first pair of terminals. An integrator unit has respectively a cable connected across the first pair of terminals of a respective Rogowski coil.

2. Discussion of the Related Art

Devices that measure electricity usage typically employ CTs. CTs are generally installed so that the electrical current of the load to be measured flows through the transformer such that an output signal is produced by magnetic coupling.

Most CTs in use today employ various types of metal cores to concentrate magnetic flux. Metal core CTs are problematic in that they are not flexible and may be difficult to install in applications in which physical space is limited or the primary conductor is relatively large in size or irregular in shape. This can be a problem of significant concern when retrofitting electricity meters into existing buildings.

One alternative to metal core CTs is the use of a Rogowski coil. The principle of the Rogowski coil is well-known, wherein if a coil of uniformly spaced turns that is wound on a former of constant cross-sectional area is arranged in a loop, then the instantaneous voltage induced in the coil is proportional to the rate of change of the total current passing through the loop at any instant. By connecting an integrator to the two terminals of the Rogowski coil, it is then possible to provide a voltage as an output that is proportional to the current passing through the loop. Such a device is sometimes referred to as a Rogowski transducer.

The use of Rogowski coils also provides an advantage in that they can be constructed of flexible material, and can be used in areas where space is limited. In addition, the Rogowski coil is suitable for use when it is not practical or desirable to disconnect a conductor, because the coil can be looped around the conductor.

In addition, Rogowski coils can be built into a flexible rope-like form that is more easily-positioned around primary conductors when surrounding physical space is limited. When using Rogowski coils an electronic integrator is required to produce an output that is proportional to the measured current. The use of an electronic integrator results in added complexity and expense, which are factors contributing to the historically limited use of this device. Typically, a Rogowski transducer would be a temporary testing device and was not envisioned for pro-longed installation to monitor a particular conductor.

There are electricity monitoring products available today that employ Rogowski coils for measuring electric current. These products are generally designed for temporary test applications and are not readily useful or cost-effective for permanent electricity monitoring applications.

FIG. 1A is a drawing of a known application of a Rogowski coil 100 used to monitor current. A wire 105 is wrapped around the core 110. The coil 100 is arranged so that an electrical conductor 115 intersects the center opening of the coil 100. The coil 100 has two terminals 122, 123, which are connected to an integrator 200. When current flows in the conductor 115, a flux in the coil 100 produces an output voltage at the terminals 122, 123. Based on the output voltage at the terminals of the coil 122, 123, the integrator 200 associated with an operational amplifier produces an output signal which is proportional to the current flowing in the conductor 115. In FIG. 1A, "I(t)" represents a current generated by the Rogowski coil 100 as a function over time, "Z" represents a cable connecting a Rogowski coil 100 with an integrator 200, "R" represents a resistor and "C" represents a capacitor, both associate with an operational amplifier to create an integrator 200. The Output is a voltage represented as a voltage function "v(t)" which varies over time.

The particular integrator shown in FIG. 1A is active integrator because it uses an operational amplifier. There are also passive integrators constructed of capacitors, resistors and/or inductors, but these integrators do not contain an operational amplifier. Passive integrators tend to be less stable in their output. However, even active integrators have some drawbacks. For example, a periodic reset of the operational amplifier may be used so that the output does not ramp, which would be undesirable if the device is used for current monitoring.

Accordingly, until microprocessor-based circuitry became widely available, the Rogowski coil had a drawback in that coil output voltage and power were not large enough to be used with typical monitoring equipment. In addition, sometimes the impedance of Rogowski coils would vary individually to the extent that it would be required to recalibrate the monitoring equipment if a coil was replaced, or in the event the coil was part of test equipment used to monitor more than conductor. Thus, it was difficult to substitute one Rogowski coil for another in the case of a field repair/upgrade. Recalibration was especially a problem if there was a large difference in the amount of current passing through respective conductors.

Thus, in large current environments CTs often use large, bulky conventional coils that are difficult to position around conductors, particularly at sites where extra space at the conductors is limited.

SUMMARY OF THE INVENTION

The present invention provides a practical and cost-effective alternative to metal core CTs for use both in retrofitting electricity metering applications and new applications. While the CT sub-system of the present invention can be used as temporary testing equipment, the CT system is designed for long-term (pro-longed) installations so that continuous monitoring of energy output is provided for effective power management, preferably including fault detection.

According to a first aspect of the invention, the flexible CT sub-system is interfaced directly with an energy monitoring and control system. However, it is to be understood that the present invention can be implemented with many different types of monitoring and control systems, such as those sold by ADMMICRO, Inc., Roanoke, Va., www.admmicro.com, and the invention is not limited to the examples provided in the specification and drawings.

With respect to the required integration function, a single electronic assembly provides high precision for up to three enhanced Rogowski coils. According to the present invention, the single electronic assembly provides the integration function for multiple-phase conductors, making the invention suitable for use with three phase power measurement. The Rogowski coils can be manufactured in the form of rope coils, where at least one of the terminals is pluggable into a socket or connector, and can be removed for easy installation around a conductor.

According to another aspect of the invention, a CT comprising Rogowski coils has an inline calibration unit built into each coil. The inline calibration unit may comprise an adjustable precision potentiometer. The precision potentiometer allows for easier calibration, both at the point of manufacture and in the field. Particularly, if there is a field installation wherein the monitoring equipment is being installed/retrofitted with Rogowski coils, the built-in potentiometers can provide for quick and easy tuning of the coils.

In addition, a CT according to the present invention may include Rogowski coils having on-board range selection switches, so that multiple electrical current ranges can be supported. In an aspect of the invention, the switches can be used to select a full scale current range of 500 amps, 1000 amps, 2000 amps or 2500 amps.

According to yet another aspect of the present invention, the CT comprises a Flexible CT Assembly wherein the Rogowski coils are made of a flexible material, permitting the bending of the coils in field installations where space is limited.

According to another aspect of the invention, a CT assembly includes:

a first Rogowski coil comprising a first closeable loop having an electrically conductive coil member with a first pair of terminals;

a second Rogowski coil comprising a second closeable loop having an electrically conductive coil member with a second pair of terminals;

a third Rogowski coil comprising a third closeable loop having an electrically conductive coil member with a third pair of terminals;

an integrator unit being separately connected to each of the first, second and third closeable loops, including a first connection to a first pair of terminals of the first loop, a second connection to a second pair of terminals of the second loop, and a connection across the third pair of terminals of the third loop, wherein each respective loop provides a respective output voltage that is proportional to the rate of change of current in a respective electrical conductor of a phase of a multiphase circuit arranged within an opening of the closeable first loop of the respective Rogowski coil, and wherein the integrator unit receives each respective output voltage and provides an output signal proportional to the respective electrical conductor arranged within an opening of each closeable loop. While it is preferred that the output signal is proportional to current in the load, there can be a signal provided to monitor voltage, real power, reactive power, and apparent power, for up to three phases associated with a typical poly-phase electrical load.

The integrator assembly produces an output signal in response to the output voltage received over the cable to the terminals of the respective Rogowski coil.

Thus, in an embodiment a current transformer assembly includes a first Rogowski coil having a first closeable loop with an electrically conductive coil member and a first pair of terminals. A second Rogowski coil includes a second Rogowski coil having a second closeable loop with an electrically conductive coil member and a second pair of terminals. A third Rogowski coil has a third closeable loop with an electrically conductive coil member and a third pair of terminals. An integrator unit has a first cable connected across the first pair of terminals of the first Rogowski coil, a second cable connected across the second pair of terminals of the second Rogowski coil, and a third cable connected across the third pair of terminals. Each respective Rogowski coil provides an output voltage received by the integrator assembly caused by when a respective electrical conductor on a phase of a multiphase circuit is arranged within an opening of the closeable first loop of the respective Rogowski coil, and provides an output signal proportional to a current in a conductor arranged in an opening of a Rogowski coil. At least one of the Rogowski coils includes an inline calibration unit for fast calibration and recalibration when retrofitting a monitor module that monitors a value of the current in one or more conductors.

BRIEF DESCRIPTION OF THE DRAWINGS

It is to be understood by a person of ordinary skill in the art that the follow figures are provide for purposes of illustration and not for limitation. A person of ordinary skill in the art understands and appreciates that the present invention can take any number of forms other than what is shown in the drawings.

DETAILED DESCRIPTION OF THE INVENTION

Figure 1A:
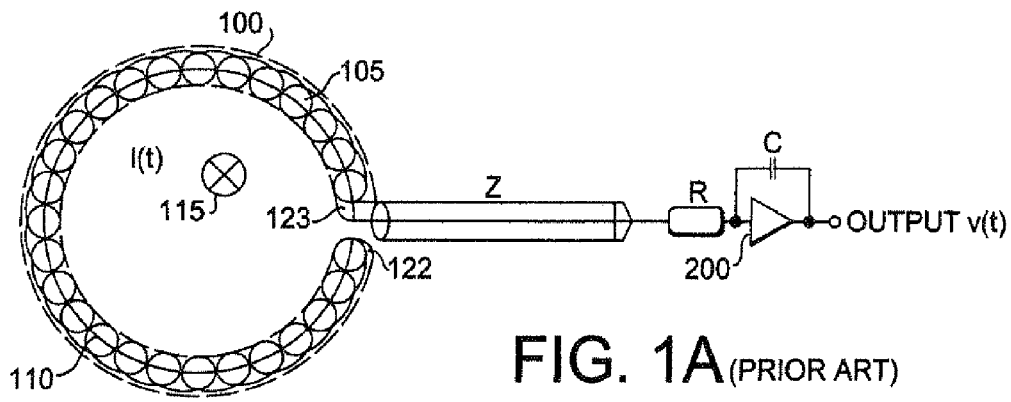
FIG. 1A shows a conventional current monitor using a Rogowski coil.
Figure 1B:
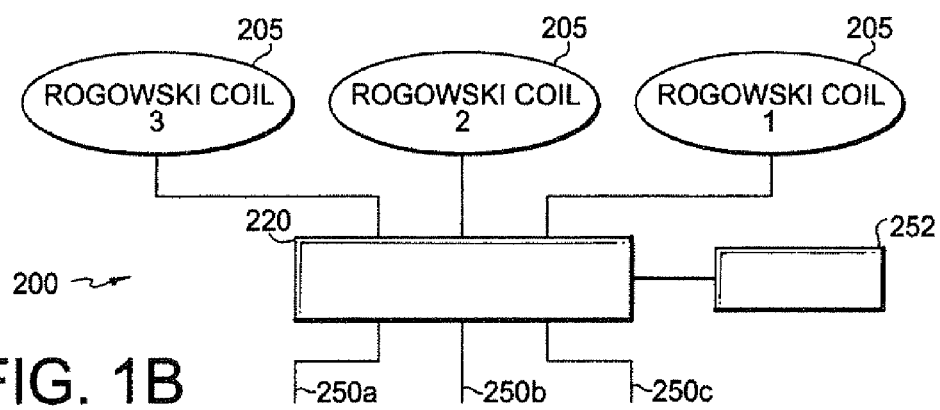
FIG. 1B is a schematic of a three phase CT according to an aspect of the invention.
Figure 2:
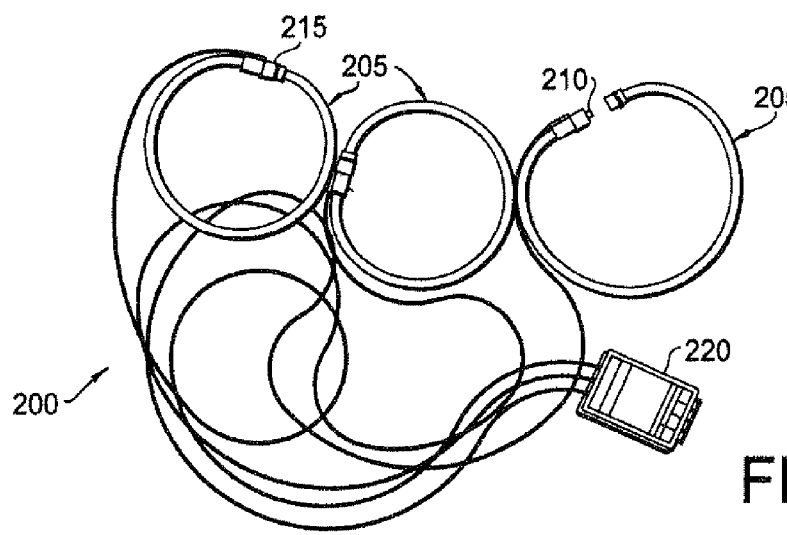
FIG. 2 shows the Flexible CT Assembly according to the present invention.

FIGS. 1B and 2 show a first aspect of a Flexible CT Assembly 200 according to the present invention. There are three Rogowski coils 205 because this particular CT assembly is suitable for use with three phase power, including but in no way limited to, for example, applications such as three phase 208V, three phase 475V, and/or significantly higher values; the amperage through the conductors be monitored can typically be in the 500-2000 amp range, but is also operable at levels much higher or much lower levels, and a person of ordinary skill in the art appreciates that the capabilities of the Flexible CT Assembly can be adapted according to need.

Referring to FIG. 2, the photo of the Rogowski coils 205 are referred to as "rope coils", and can typically have an open or free end 210 that can be connected by socket or coil connector mechanism 215. Typically the free end 210 of the coil 205 can snap into the socket or connector. There are coil connector mechanisms 215 that may comprise a pluggable socket. Each coil connector has a pair of terminals which is used to provide an output voltage to the electronic integrator assembly 220.

Referring again to FIG. 1B and FIG. 2, the integrator assembly 220 receives the output voltage of each Rogowski coil 205 and provides a signal output by respective outputs 250a, 250b, 250c that is proportional to the current of the output load of a line or line passing through the center of the respective coil. Thus in a three phase system, each coil 205 monitors a separate phase of a multi-phase conductor. The integrator can be active or passive, but is preferably active. An auxiliary power input 252 may provide power for the integrator to function.

Figure 3:
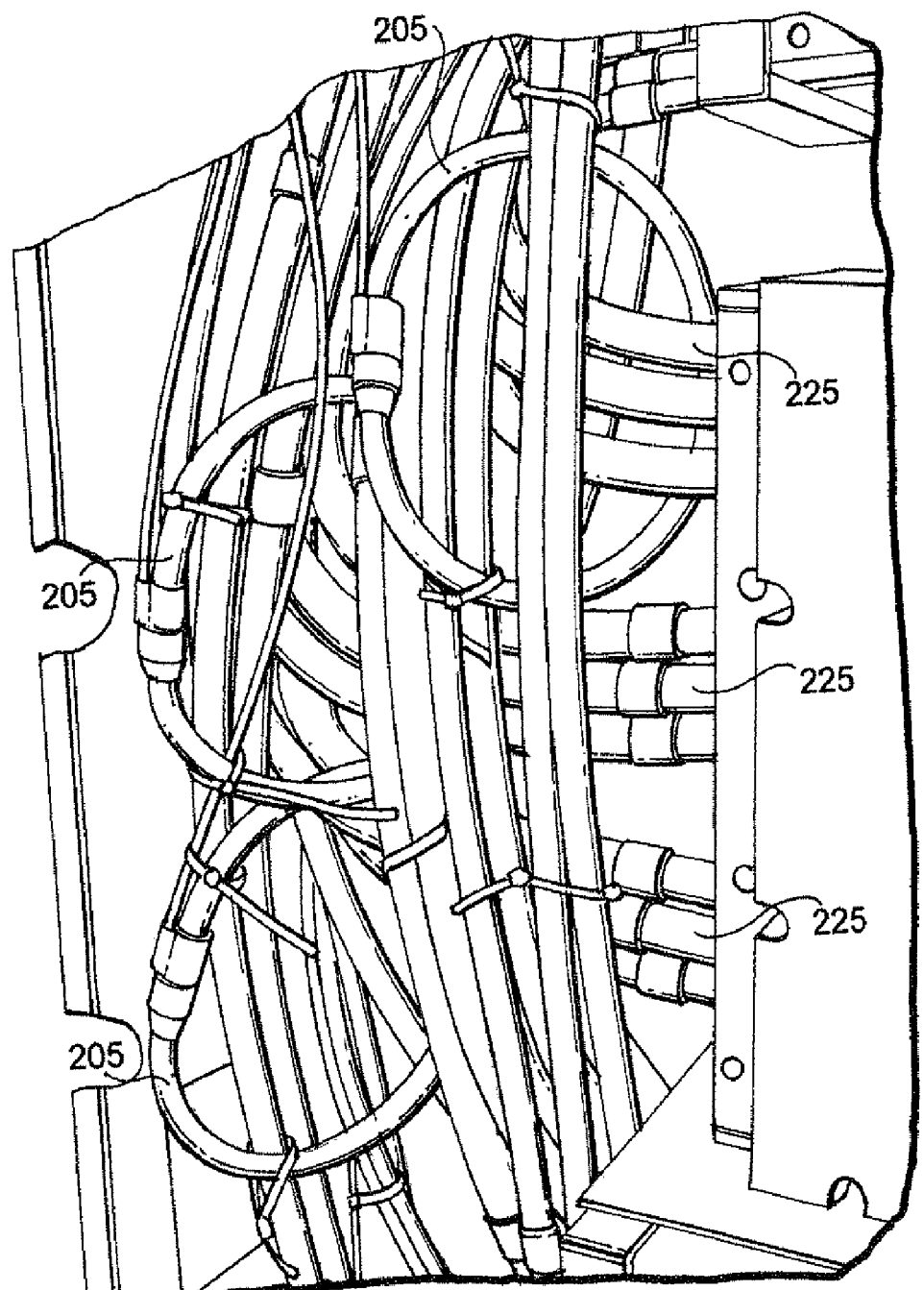
FIG. 3 shows an embodiment of the invention installed around a conductor for monitoring current of a three-phase electrical load.

FIG. 3 depicts Rogowski coils configured as rope coils 205 wrapped respectively around one phase of conductors 225 in a three phase system. As shown in FIG. 3, the rope coils 205 are not limited to being wrapped around a single conductor, and in this particular case each of the conductors comprises three cables. With reference to FIG. 3, a person of ordinary skill in the art appreciates the difficulty there would have been to arrange the coils if they were not able to open up so as to fit around the respective conductors 225. Thus, the use of flexible rope coils that can fit around the conductors and be snapped into place provides an advantage over CTs having solid metal core coils.

Figure 4:
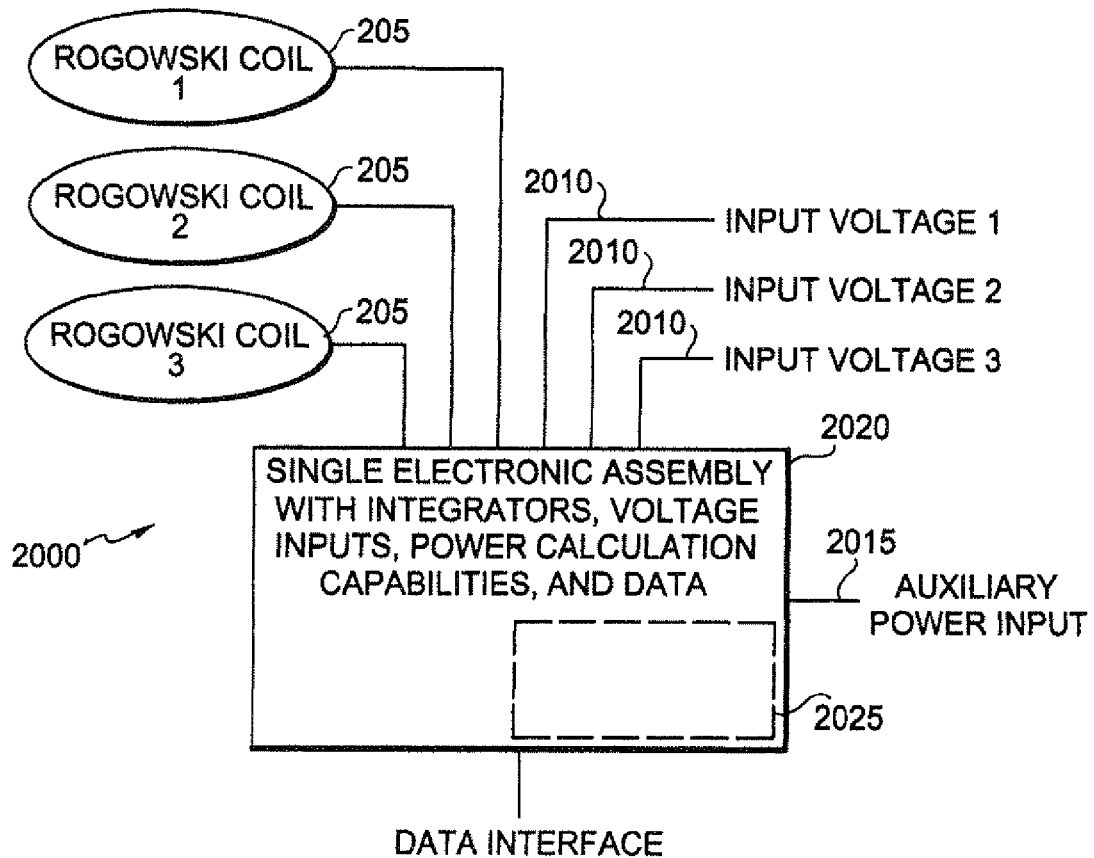
FIG. 4 is a schematic of a CT Assembly interfaced with an energy monitoring and control system.

FIG. 4 shows a CT 2000 having three Rogowski coils 205, three respective voltage inputs 2010 for direct measurement of up to three voltages, an auxiliary power input 2015, and an energy monitoring and control system 2020 including integrators, power calculation capabilities, and a data interface so the resulting power values can be accessed by external data systems. Typically energy monitoring and control system 2020 is a single electronic assembly including integrators, power calculation capabilities, and a data interface so the resulting power values can be accessed by external data systems.

Still referring to FIG. 4, the energy monitoring and control system 2020 receives outputs from the Rogowski coils. In fact, the energy monitoring and control system 2020 is an optional component, and also it is within the spirit of the invention that a CT shown in FIG. 2, with or without the integrator 220, can have its output lines connected to the input of the system 2020, or the instantaneous voltage across the respective terminals of the Rogowski coils can be input into the system 220, which will perform the integration and/or processing as desired.

The energy monitoring system and control system 2020 includes a data interface and a security module 2025. The security module will receive notification via the data interface from the monitoring system 2020 when the energy monitored exceeds a predetermined threshold. The energy monitoring and control system 2020 can be any conventional system that can accept either the voltage output of the Rogowski coils, or the integrated signal proportional to the current in the conductor, etc.

For example, U.S. Pat. No. 6,728,646 to Howell et al., incorporated herein by reference in its entirety as background material, discloses an energy information system and sub-measurement board for use therewith to allow an energy information service provider to measure energy usage at a customer location. However, it is to be understood that the present invention could use any system to provide measurement and control capabilities for monitoring and controlling a plurality of single phase and poly-phase electrical loads, such as those sold by ADMMICRO Inc., Roanoke, Va., www.admmicro.com.

In addition, the security module 2025 includes a communication unit (not shown) for contacting a monitoring office, computer, any electronic communication device capable or receiving a message, wired or wireless, satellite or via the Internet, and/or responsible maintenance personnel when the monitoring system 2020 has determined that the energy monitored is outside of an expected range.

The provision of all the required electronics into a single package provides cost-effective use of Rogowski coils for monitoring of other electric power values such as voltage, real power, reactive power, and apparent power, in addition to current values, for up to three phases with a typical poly-phase electrical load.

Figure 5:
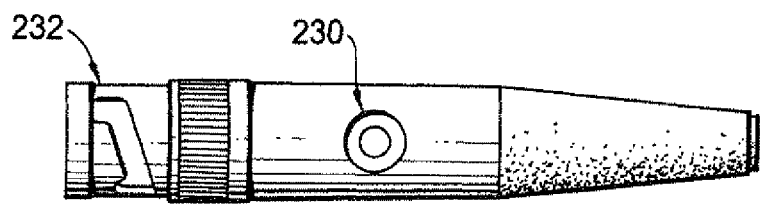
FIG. 5 shows a version of the twist-lock mechanism and the inline calibration potentiometer according to the present invention.

FIG. 5 shows another aspect of the invention, wherein an inline calibration unit 230 and a quarter-turn twist lock connector 232 are both shown. Typically, it is preferred that the inline calibration unit comprises an adjustable precision potentiometer 230 built into the coil for calibration. Each coil sub-assembly is calibrated during the manufacturing process specifically for use with the electronic assembly described. This aspect of the invention provides for interchangeable coil sub-assemblies to facilitate field installation. In addition, this calibration unit will assist field technicians who are retrofitting monitoring equipment to use Rogowski coils according to the present invention.

Another aspect of the invention provides the following additional capabilities:

Additional on-board calibration potentiometers for each of the three enhanced Rogowski coil inputs. This aspect of the invention provides an additional calibration mechanism that can be employed to provide measurement accuracy beyond manufacturing specifications with enhanced Rogowski coils, or so that the electronic assembly of this invention can be used with other Rogowski coil products that do not provide an integrated calibration mechanism.

On-board range selection switches may be provided for each of the three enhanced Rogowski coil inputs so that multiple electrical current ranges can be supported. In one implementation, these switches can be used to select a full scale current range of 500 amps, 1000 amps, 2000 amps or 2500 amps.

Electrically isolated electronics are provided such that no signal common connection is required between the electronic assembly of this invention and the electrical monitoring device to which the system of this invention is connected.

Thus, the invention provides an advantage over metal core CTs at least in terms of flexibility, an ability to calibrate or recalibrate one or more coils outside the factory, which is of great value to personnel in the field, and a series of selection switches and a twist lock to enable the CTs installation to monitor a variety of types of conductors.

It is apparent that embodiments other than those specifically described above come within the spirit and scope of the present invention. The present invention is not limited by the above description but rather is described by the claims appended hereto.

The invention claimed is:

1. A current transformer (CT) assembly comprising:
   a first Rogowski coil comprising a first closeable loop having an electrically conductive coil member with a first pair of terminals;
   a second Rogowski coil comprising a second closeable loop having an electrically conductive coil member with a second pair of terminals;
   a third Rogowski coil comprising a third closeable loop having an electrically conductive coil member with a third pair of terminals; and
   an integrator assembly unit being separately connected to each of the first, second and third closeable loops, including a first connection to the first pair of terminals of the first loop, a second connection to the second pair of terminals of the second loop, and a third connection across the third pair of terminals of the third loop, wherein the integrator assembly unit receives a respective output voltage from at least one closeable loop and provides an output signal proportional to the respective electrical conductor arranged within an opening of the at least one closeable loop, and wherein each Rogowski coil includes one or more on-board selection switches for selecting a range of current values for monitoring from multiple available ranges of current values.

2. The CT assembly according to claim 1, wherein the integrator assembly unit provides a separate output signal for each respective coil, said separate output signal being proportional to the output voltage of a respective Rogowski coil.

3. The CT assembly according to claim 2, further comprising:
a monitor module that is coupled to the output of the integrator and monitors energy usage of the respective electrical conductor to generate a measurement of energy usage by the conductor.

4. The CT assembly according to claim 1, wherein the integrator assembly unit integrates the value of output voltage received from at least one of a respective Rogowski coil and provides an output signal proportional to a value of current or voltage of the respective electrical conductor arranged within an opening of the at least one respective Rogowski coil.

5. The CT assembly according to claim 1, wherein the output signal is proportional to a value of real power in the respective electrical conductor arranged within an opening of each respective Rogowski coil.

6. The CT assembly according to claim 1, wherein the output signal is proportional to a value of apparent power in the respective electrical conductor arranged within an opening of each respective Rogowski coil.

7. The CT assembly according to claim 1, wherein the output signal is proportional to a value of reactive power in the respective electrical conductor arranged within an opening of one or more of each respective Rogowski coil.

8. The CT assembly according to claim 1, wherein at least one of the first, second, and third Rogowski coils has a core made of a flexible material.

9. The CT assembly according to claim 1, wherein at least one of the first, second, and third Rogowski coils further comprises an inline calibration unit within the Rogowski coils for calibrating impedance.

10. The CT assembly according to claim 9, wherein the inline calibration unit comprises a precision potentiometer.

11. The CT assembly according to claim 9, wherein the inline calibration unit includes a quarter turn twist-lock connector assembly.

12. The CT assembly according to claim 1, wherein the integrator assembly unit comprises a passive integrator and includes a coil damping resistor.

13. The CT assembly according to claim 1, wherein the integrator assembly comprises an active integrator.

14. The CT assembly according to claim 1, wherein the selection switches enables energy monitoring of a full scale current range of no more than 100 amps.

15. The CT assembly according to claim 1, wherein the selection switches enables energy monitoring of a full scale current range of no more than 500 amps.

16. The CT assembly according to claim 1, wherein the selection switches enables energy monitoring of a full scale current range of no more than 1000 amps.

17. The CT assembly according to claim 1, wherein the selection switches enables energy monitoring of a full scale current range of no more than 2000 amps.

18. The CT assembly according to claim 1, wherein the selection switches enables energy monitoring of a full scale current range of more than 2500 amps.

19. The CT assembly according to claim 1, wherein the multiple available ranges of current values are selected from the group consisting of 500, 1000, 2000, and 2500 amps.

20. A current transformer (CT) assembly comprising:
a Rogowski coil comprising a first closeable loop having an electrically conductive coil member with a first pair of terminals;
an integrator assembly having a cable connected across the first pair of terminals of the Rogowski coil; and
an inline calibration unit arranged in the Rogowski coil;
wherein the Rogowski coil provides an output voltage that is received by the integrator assembly when an electrical conductor of a circuit is arranged within an opening of the closeable first loop of the Rogowski coil;
wherein the integrator assembly produces an output signal that is proportional to the output voltage of the coil in response to the output voltage received from the Rogowski coil; and
wherein each Rogowski coil includes one or more on-board selection switches for selecting a range of current values for monitoring from multiple available ranges of current values.

21. The CT assembly according to claim 20, further comprising a security module operatively coupled to the monitor module, said security module including a communication means for notification when the monitor module monitors a value outside of a predetermined range of values.

22. The CT assembly according to claim 20, further comprising:
a monitor module that is coupled to the output of the integrator and monitors energy usage of the electrical conductor to generate a measurement of energy usage by the conductor.

23. The CT assembly according to claim 22, further comprising a security module operatively coupled to the monitor module, said security module including a communication means for notification when the monitor module monitors a value outside of a predetermined range of values.

24. The CT assembly according to claim 20, wherein the multiple available ranges of current values are selected from the group consisting of 500, 1000, 2000, and 2500 amps.

* * * * *

UNITED STATES PATENT AND TRADEMARK OFFICE
CERTIFICATE OF CORRECTION

PATENT NO.       : 7,598,724 B2                                                Page 1 of 1
APPLICATION NO.  : 12/015747
DATED            : October 6, 2009
INVENTOR(S)      : Donald W. Howell et al.

It is certified that error appears in the above-identified patent and that said Letters Patent is hereby corrected as shown below:

Column 8, lines 38-42, cancel the text
"21. The CT assembly according to claim 20, further comprising a security module operatively coupled to the monitor module, said security module including a communication means for notification when the monitor module monitors a value outside of a predetermined range of values."

and insert the following claim:

--21. The CT assembly according to claim 3, further comprising a security module operatively coupled to the monitor module, said security module including a communication means for notification when the monitor module monitors a value outside of a predetermined range of values.--

Signed and Sealed this

Twenty-sixth Day of October, 2010

David J. Kappos
*Director of the United States Patent and Trademark Office*